(12) United States Patent
Yoon et al.

(10) Patent No.: US 10,615,422 B2
(45) Date of Patent: Apr. 7, 2020

(54) CERAMIC CATALYST, METHOD OF MANUFACTURING CERAMIC CATALYST, AND FUEL CELL

(71) Applicant: GACHON UNIVERSITY OF INDUSTRY-ACADEMIC COOPERATION FOUNDATION, Seongnam-Si, Gyeonggi-Do (KR)

(72) Inventors: Young Soo Yoon, Seoul (KR); Seok Hee Lee, Seoul (KR); Sung Pil Woo, Ulsan (KR); Seo Yoon Shin, Seoul (KR)

(73) Assignee: GACHON UNIVERSITY OF INDUSTRY-ACADEMIC COOPERATION FOUNDATION (KR)

( * ) Notice: Subject to any disclaimer, the term of this patent is extended or adjusted under 35 U.S.C. 154(b) by 197 days.

(21) Appl. No.: 15/715,093

(22) Filed: Sep. 25, 2017

(65) Prior Publication Data
US 2018/0108918 A1    Apr. 19, 2018

(30) Foreign Application Priority Data

Oct. 19, 2016 (KR) .................. 10-2016-0135746
Aug. 22, 2017 (KR) .................. 10-2017-0106291

(51) Int. Cl.
| | |
|---|---|
| *H01M 4/90* | (2006.01) |
| *B01J 35/02* | (2006.01) |
| *B01J 23/96* | (2006.01) |
| *B01J 23/70* | (2006.01) |
| *H01J 37/26* | (2006.01) |
| *B82Y 40/00* | (2011.01) |

(52) U.S. Cl.
CPC ............... *H01M 4/90* (2013.01); *B01J 23/70* (2013.01); *B01J 23/96* (2013.01); *B01J 35/02* (2013.01); *H01M 4/9016* (2013.01); *H01M 4/9075* (2013.01); *B82Y 40/00* (2013.01); *H01J 37/26* (2013.01)

(58) Field of Classification Search
None
See application file for complete search history.

(56) References Cited

U.S. PATENT DOCUMENTS

2007/0190375 A1* 8/2007 Gorobinskiy .......... B01J 8/0221
429/412

FOREIGN PATENT DOCUMENTS

| JP | 2007252991 A | 10/2007 |
|---|---|---|
| KR | 20070035711 A | 4/2007 |
| KR | 20110007350 A | 1/2011 |
| KR | 20110013968 A | 2/2011 |

OTHER PUBLICATIONS

English translation of JP2007-252991A (Year: 2007).*
Lee, Sang Ho et al., "Patterned catalyst arrays of Pd/SnO2 core-shell nanowires for electrooxidations of biomass-derived alcohols", Journal of Materials Chemistry A, 2015, 3, 13492-13499.

* cited by examiner

*Primary Examiner* — Lucas J. O'Donnell
(74) *Attorney, Agent, or Firm* — Renaissance IP Law Group LLP (57) ABSTRACT

Provided is a ceramic catalyst which may include a nanostructure composed of ionic salts; and catalyst particles attached to the surface of the nanostructure.

14 Claims, 5 Drawing Sheets

CERAMIC CATALYST, METHOD OF MANUFACTURING CERAMIC CATALYST, AND FUEL CELL

CROSS-REFERENCE TO RELATED APPLICATION

This application claims priority to Korean Patent Application Nos. 10-2016-0135746 filed on Oct. 19, 2016 and 10-2017-0106291 filed on Aug. 22, 2017 and all the benefits accruing therefrom under 35 U.S.C. § 119, the contents of which are incorporated by reference in their entirety.

BACKGROUND

The present disclosure relates to a ceramic catalyst, a method of manufacturing a ceramic catalyst, and a fuel cell, and more particularly, to a ceramic catalyst capable of increasing a catalyst active area, a method of manufacturing a ceramic catalyst, and a fuel cell.

A fuel cell is a power generation device that utilizes a technique in which the chemical energy of fuel is directly converted into an electric energy by an electrochemical reaction, and is an electrochemical power generation device that supplies hydrogen and oxygen in the air to a positive electrode and a negative electrode, respectively, to continuously produce electricity.

Recently, biomethane, which is a main component of natural gas, and has an advantage of being capable of substituting energy sources having limited reserves such as petroleum and coal, is highlighted as the fuel for fuel cells. Biomethane is produced by removing unnecessary substances from biogas composed of methane and carbon dioxide formed by decomposition of organic matter and performing purification such that the concentration of methane becomes about 98%.

In order to operate the fuel cell using such biomethane as fuel, it is necessary to decompose methane to produce hydrogen. Technical methods for producing hydrogen are largely classified into: firstly, a method based on a hydrocarbon material, for example, a methane steam reforming method, a partial oxidation method of heavy oil, and a catalyst decomposition of natural gas; secondly, a method using thermochemistry; and thirdly, a combination method of the two methods.

In the fuel cell, hydrogen is produced by decomposing methane through a high-temperature pyrolysis method, which decomposes directly substances mainly only by heat, to produce hydrogen, and reaction is carried out at high temperature under low pressure in order to increase a methane decomposition rate. However, when the reaction is carried out at high temperature so as to obtain a high decomposition rate, a polymer electrolyte membrane in a polymer electrolyte fuel cell is melted to lose the function as an ion conductor, and the fuel cell is thus unable to be operated. In this case, it is possible to lower the reaction temperature by using a metal catalyst such as copper, gold or the like which is widely used, but the activity of the catalyst may be deteriorated due to byproducts such as carbon and carbon monoxide generated during a decomposition reaction, thereby acting as a fatal factor to the catalyst.

Further, in order to cause the catalyst reaction to occur well, it is necessary to have a large catalyst active area per unit area so that a reactant may contact the catalyst in a wider area. However, the catalyst generally used has a spherical shape, and when the catalyst is used in the fuel cell, spherical catalyst particles are used to be dispersed and supported in the limited space of a catalyst support, so that the catalyst activity may become low due to a small specific surface area per unit area.

PRIOR ART DOCUMENTS

Patent Documents (Patent Document 0001) KR Patent Publication No. 10-2007-0035711

SUMMARY

The present disclosure provides a ceramic catalyst in which a catalyst active area of a catalyst particle attached to the surface of a nanostructure is increased, a method of manufacturing a ceramic catalyst, and a fuel cell.

In accordance with an exemplary embodiment, a ceramic catalyst includes a nanostructure composed of ionic salts, and catalyst particles attached to the surface of the nanostructure.

A void space may be partially formed between the nanostructure and the catalyst particles.

The catalyst particles may be particles composed of metal oxide.

The catalyst particles may be insoluble in a polar solvent.

The nanostructure may have properties of being dissociated and ionized by water.

In accordance with another exemplary embodiment, a method of manufacturing a ceramic catalyst may include forming a nanostructure composed of ionic salts; and attaching catalyst particles to the surface of the nanostructure.

The attaching of the catalyst particles may include attaching metal particles to the surface of the nanostructure; and oxidizing the metal particle.

In the attaching of the catalyst particles, the metal particles may be attached in a metal oxide state.

In the attaching of the catalyst particles, the catalyst particles may be prepared through hydrothermal synthesis.

After the attaching of the catalyst particles, the method may further include dissolving and removing a part of ionic salts of the nanostructure in a polar solvent.

In accordance with yet another exemplary embodiment, a fuel cell in accordance with an exemplary embodiment includes a fuel electrode in which decomposition of fuel and an oxidation reaction of hydrogen are carried out; an air electrode which is provided to correspond to the fuel electrode and in which a reduction reaction of oxygen is carried out; and a polymer electrolyte membrane disposed between the fuel electrode and the air electrode to allow hydrogen ions to move from the fuel electrode to the air electrode, wherein the fuel electrode includes a ceramic catalyst containing a nanostructure composed of ionic salts, and catalyst particles attached to the surface of the nanostructure; and a catalyst support configured to support the ceramic catalyst.

The ceramic catalyst may be obtained by three-dimensionally stacking, on the catalyst support, a plurality of nanocomposites composed of nanostructures and catalyst particles.

The nanostructure may be at least partially ionized by water inside the fuel cell.

A fuel supplied to the fuel electrode may be decomposed by the ceramic catalyst at a temperature lower than 200° C.

The fuel cell further may include an oxide layer formed on the surface of the catalyst support.

A void space may be partially formed between the nanostructure and the catalyst particles.

The catalyst particles may include a particle composed of a metal oxide.

The catalyst particles may be insoluble in a polar solvent.

BRIEF DESCRIPTION OF THE DRAWINGS

Exemplary embodiment can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions may be exaggerated for clarity of illustration and like reference numerals refer to like elements throughout.

Figure 1:
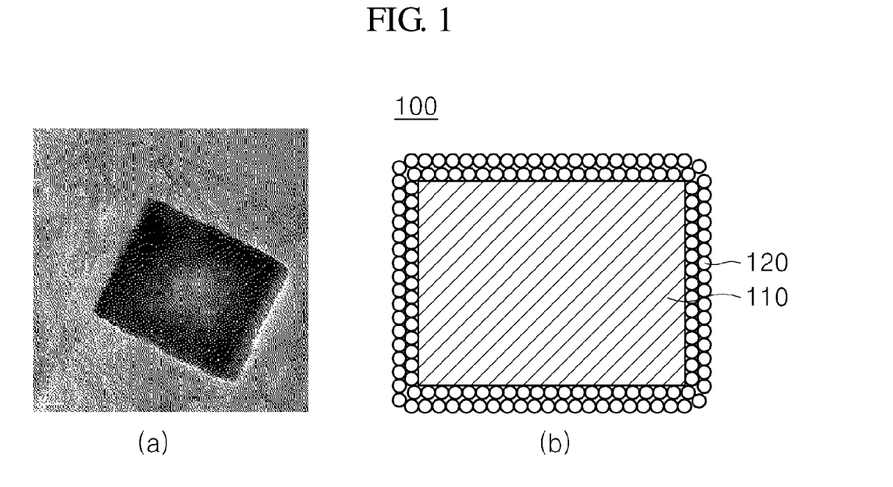
FIG. 1 is a transmission electron microscope (TEM) photograph of a ceramic catalyst and a conceptual view illustrating the ceramic catalyst in accordance with an exemplary embodiment.

FIG. 1 is a transmission electron microscope (TEM) photograph of a ceramic catalyst and a conceptual view illustrating the ceramic catalyst in accordance with an exemplary embodiment.

Referring to FIG. 1, a ceramic catalyst 100 in accordance with an exemplary embodiment may include a nanostructure 110 composed of ionic salts; and catalyst particles 120 attached to the surface of the nanostructure 110.

The ceramic catalyst 100 may include the nanostructure 110 composed ionic salts and the catalyst particles 120 attached to the surface of the nanostructure 110. In exemplary embodiments, a plurality of the catalyst particles 120 are attached to the surface of the nanostructure 110 having a three-dimensional shape such that the catalyst particles 120 substantially serving as a catalyst have a high catalyst active area per unit area to provide a sufficient reaction active area for a reactant, thereby forming the ceramic catalyst 100.

A typical catalyst is directly attached to a flat surface rather than the surface of a structure having a certain three-dimensional shape, for example, the catalyst particles 120 are stacked or filled while contacting the surface of a limited space in which reaction occurs. Thus, the typical catalyst has a problem of having a low catalyst activity due to a low specific surface area per unit area.

On the other hand, unlike the typical catalyst described above, the ceramic catalyst 100 in accordance with an exemplary embodiment is formed in a shape such that the plurality of catalyst particles 120 are attached to the entire surface of the three-dimensional nanostructure 110. Therefore, the catalyst active area per unit area in which the catalysts particles may contact the reactant becomes large to enable to much more improve the reactivity.

For example, when used as a catalyst for a fuel electrode 210 of a fuel cell, the typical catalyst is used in such a way that catalyst particles are in direct contact with the surface of the catalyst support 211 and then dispersed and supported on the catalyst support 211; whereas the ceramic catalyst 100 in accordance with exemplary embodiments is used in such a way that the catalyst particles 120 are supported on the catalyst support while being attached to the surface of the nanostructure 110. Therefore, the specific surface area or catalyst active area per unit area, in which the catalyst particles come into contact with the fuel of the fuel cell in the limited space of the catalyst support 211, may be increased so that the ceramic catalyst 100 may exhibit more improved catalyst activity than typical catalysts.

The shape of the nanostructure 110 is not limited, but the nanostructure 110 may be formed in various shapes as long as the nanostructure 110 has a three-dimensional shape to enable the specific surface area per unit area of the attached catalyst particle 120 to be increased. In addition, a material forming the nanostructure 110 may be a material having a crystal structure capable of easily forming the nanostructure 110 without acting as a catalyst, and may include, for example, an ionic salt such as NaF, NaCl, CaO, MgO, and KCl, and an ionic salt in which at least one among Li, Na, K, Rb, Cs, Mg and Ca of Group 1 elements and Group 2 elements is mixed with at least one among O, S, Cl, Br and I of Group 16 elements and Group 17 elements.

The catalyst particle 120 attached to the surface of the nanostructure 110 may be a particle composed of a metal oxide.

The catalyst particle 120 in accordance with an exemplary embodiment is a particle composed of the metal oxide and thus contains an oxygen atom therein. Therefore, carbon monoxide or the like which causes poisoning of the catalyst may be removed in a gaseous phase, and poisoning is a phenomenon in which a very small amount of other substances adsorbs or bonds to the catalyst to decrease the activity of the catalyst.

The catalyst composed of metal particles not having oxygen atoms is poisoned by the carbon monoxide existing on the periphery of the catalyst and has a problem in that it is difficult to perform a role as a catalyst. However, in the ceramic catalyst 100 in accordance with an exemplary embodiment, the catalyst particles (120) are composed of metal oxides, and carbon monoxide may thus be changed into carbon dioxide and then removed. In other words, since carbon monoxide may be changed into carbon dioxide on the surface of the particle composed of the metal oxide and then removed, the catalyst particles 120 composed of the metal oxides may very easily alleviate or reduce, without a complicated system configuration, the poisoning phenomenon of the catalyst which may be generated by carbon monoxide.

In addition, the particles, which are composed of metal oxides and attached to the surface of the nanostructure 110, may serve as, for example, a catalyst for decomposing the fuel in the fuel cell. The particles composed of metal oxides may react with water molecules in the fuel cell to change into a compound having a hydroxyl group, that is, hydroxide, and the fuel supplied to the fuel electrode is decomposed by the hydroxyl group contained in the hydroxide. In one exemplary embodiment, the decomposition of methane, which is a fuel supplied to the fuel electrode 210, by nickel oxide attached to the surface of the nanostructure 110 may be represented by Reaction Formula 1 or 2 below.

[Reaction Formula 1]

[Reaction Formula 2]

As represented in Reaction Formulae 1 and 2, since the fuel may be decomposed by particles composed of metal oxides rather than metal particles, the catalyst particles 120 may be a particle made of a metal oxide in which a base metal such as Ni, Cu, Mo, Mn, Co, Fe, W, Al, Ti, Si or Sn is oxidized, rather than particles made of a noble metal such as Pt or Au which is chemically very stable and thus is not oxidized. In other words, the nickel oxide in Reaction Formulae 1 and 2 above is just an example, so that even when the catalyst particle 120 is composed of another metal oxide other than the nickel oxide, the same reaction as reaction formulae 1 and 2 may take place.

Figure 2:
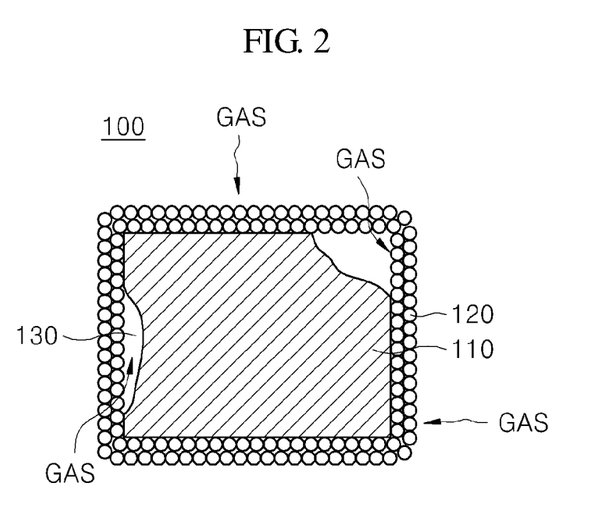
FIG. 2 is a conceptual view illustrating a ceramic catalyst having a void space in accordance with an exemplary embodiment.

FIG. 2 is a conceptual view illustrating a ceramic catalyst having a void space in accordance with another exemplary embodiment.

Referring to FIG. 2, a void space 130 may be partially formed between the nanostructure 110 and the catalyst particles 120.

In order to further increase the specific surface area or catalyst active area of the ceramic catalyst 100, the catalyst particles 120 are attached to the surface of the nanostructure 110 as described above, and also a part of the nanostructure 110 to which the catalyst particles 120 are attached is additionally removed to partially form a void space 130.

In general, the activity of the catalyst is closely related to the specific surface area. In the ceramic catalyst 100 in accordance with an exemplary embodiment, since the void space 130 is partially formed inward from a portion in which the nanostructure 110 is in contact with the catalyst particles 120, the reactant (or gas) that is reacted by the catalyst particles 120 move into the void space 130, and may thus come into contact and react with the inner surface of the catalyst particles 120 as well as the outer surface of the catalyst particle 120. In other words, when the void space 130 is formed by dissolving and removing a part of the nanostructure 110, the catalyst active area in which the catalyst particles 120 and the reactant may contact and react increases, so that a sufficient reaction active area may be provided for the reactant that is reacted by the catalyst particles 120.

In order to form the void space 130, in the process of attaching the catalyst particles 120 to the surface of the nanostructure 110 and then washing with a polar solvent such as water or acetone, the nanostructure 110 may be soluble in the polar solvent, and the catalyst particles 120 may be insoluble in the polar solvent.

In more detail, in exemplary embodiments, the void space 130 may be formed by washing, with a polar solvent, the ceramic catalyst 100 in which the catalyst particles 120 are attached to the surface of the nanostructure 110. Since the catalyst particles 120 composed of the metal oxide is attached to the surface of the nanostructure 110 and serves as a catalyst for decomposing the fuel, the catalyst particles 120 should be insoluble, that is, should remain on the surface of the nanostructure 110 even when washed, and is not dissolved in the polar solvent.

On the other hand, since the nanostructure 110 does not serve as a catalyst and provides only a space for attaching or supporting catalyst the particles 120 such that the specific surface area of the catalyst particles 120 per unit area may be increased, the nanostructure 110 may be water-soluble in the polar solvent such that the void space 130 may be formed between the nanostructure 110 and the catalyst particles 120. However, as described above, when the water-soluble nanostructure 110 is completely dissolved and removed in the polar solvent it is difficult to maintain the three-dimensional shape of the nanostructure 110 due to collapse. Therefore, only a part of the nanostructure 110 is removed during washing, thereby forming the void space 130 partially. The position or size of the void space 130 is not particularly limited as long as the reactant which is to react with the catalyst particles 120 may move in and come into contact with the inner surface of the catalyst particles 120.

Thus, when the insoluble catalyst particles 120 are attached to the surface of the nanostructure 110 that is soluble in the polar solvent and then washed, the catalyst particles 120 remains without changing and only a part of the nanostructure 110 is dissolved and removed from the outer surface thereof, so that the void space 130 may partially be formed between the nanostructure 110 and the catalyst particle 120.

As described above, in an exemplary embodiment, the catalyst particles 120 is attached to the surface of the nanostructure 110 as illustrated in FIG. 1 in order to increase the catalyst active area per unit area. Also, in order to further increase the catalyst active area per unit area to provide a sufficient reaction active area for the reactant, a portion of the nanostructure 110 which is soluble in the polar solvent is removed to partially form the void space 130 between the nanostructure 110 and the catalyst particles 120, as illustrated in FIG. 2.

The nanostructure 110 may be soluble in the polar solvent and also have properties of being dissociated and ionized by water.

When the ceramic catalyst 100 in which the catalyst particles 120 are attached to the surface of the nanostructure 110 is used for, for example, a fuel cell, the nanostructure 110 of this exemplary embodiments may have properties of being dissociated and ionized by water. Therefore, electric charges may be transferred in the operating environment of a water-containing fuel cell.

When only the catalyst particles 120 are used, as a catalyst for a fuel electrode 210 of the fuel cell, without the nanostructure 110 which is ionizable, the detachment of the catalyst particles 120 from a catalyst support 211 causes the catalyst support 211 to fail to transfer the electric current generated in the catalyst, so that the fuel electrode 210 composed of the catalyst and the catalyst support 211 does not function as the fuel electrode 210. However, the catalyst particles 120 in accordance with an exemplary embodiment are attached to the entire surface of the three-dimensional nanostructure 110. Thus, even when some of the catalyst particles 120 are separated from the catalyst support 211 by a certain distance, the nanostructure 110 may be dissociated by the water generated or supplied from the inside of the fuel cell to function as a conductor capable of transferring electric charges, thereby enabling the fuel cell to be operated. The characteristics of the nanostructure 110 will be described in detail through a fuel cell to be described later.

Figure 3:
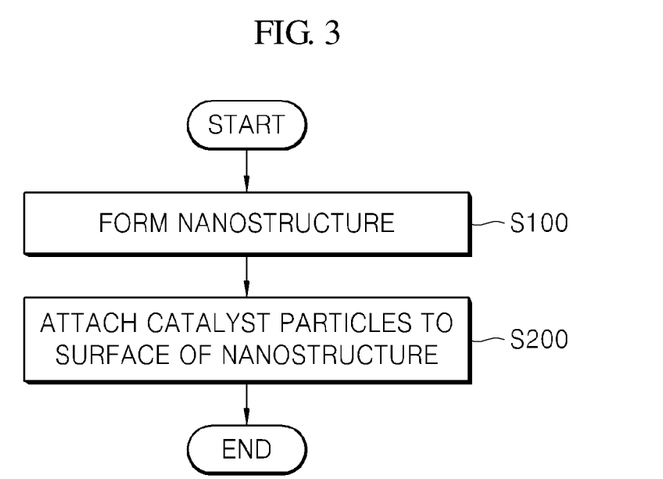
FIG. 3 is a flowchart illustrating a method of manufacturing a ceramic catalyst in accordance with another exemplary embodiment.

FIG. 3 is a flowchart illustrating a method of manufacturing a ceramic catalyst in accordance with another exemplary embodiment.

Referring to FIG. 3, a method of manufacturing the ceramic catalyst 100 in accordance with another exemplary embodiment may include forming a nanostructure 110 composed of ionic salts; and attaching catalyst particles 120 to the surface of the nanostructure 110.

In an exemplary embodiment, the ceramic catalyst 100 is formed in which a plurality of catalyst particles 120 are attached to the surface of the nanostructure 110 such that catalyst particles 120 substantially serving as a catalyst enable to have a high catalyst active area. To form such a ceramic catalyst 100, a plurality of metal precursors is first mixed to form the nanostructure 110. The nanostructure 110 may be formed of a material having a crystal structure capable of easily forming the nanostructure 110 without acting as a catalyst, and may be formed of, for example, an ionic salt such as NaF, NaCl, CaO, MgO, and KCl, and an ionic salt in which at least one among Li, Na, K, Rb, Cs, Mg and Ca of Group 1 elements and Group 2 elements is mixed with at least one element among O, S, Cl, Br and I of Group 16 and Group 17 elements.

The shape of the nanostructure 110 is not limited. However, the nanostructure 110 may be formed in various shapes as long as the nanostructure 110 has a three-dimensional shape to enable the specific surface area per unit area of the attached catalyst particles 120 to be increased.

After forming the nanostructure 110, a catalyst metal-containing precursor is added in order to attach, to the surface of the nanostructure 110, the catalyst particle 120 which substantially acts as a catalyst. In this case, when the plurality of metal precursors and the catalyst metal-containing precursor are mixed at a time, there is a problem in that the nanostructure 110 is not formed due to a material produced through a reaction between at least one of the plurality of metals and the catalyst metal. Therefore, in exemplary embodiments, to form a new type of ceramic catalyst 100, the nanostructure 110 is formed, and then the catalyst particles 120 is attached to the surface of the nanostructure 110 to form the ceramic catalyst 100.

Since a typical catalyst is directly attached to a flat surface rather than the surface of a structure having a certain three-dimensional shape, for example, the catalyst particles 120 are stacked or filled while contacting the surface of a limited space in which reaction occurs. Thus, the typical catalyst has a problem of having a low catalyst activity due to a low specific surface area per unit area. On the other hand, unlike the typical catalyst, the ceramic catalyst 100 in accordance with an exemplary is formed in a shape such that the plurality of catalyst particles 120 are attached to the entire surface of the three-dimensional nanostructure 110, so that the catalyst active area per unit area in which the catalysts particles may contact the reactant becomes large, and the reactivity may be even further improved.

In one exemplary embodiment, the attaching of the catalyst particles 120 may include attaching metal particles to the surface of the nanostructure 110; and oxidizing the metal particles. In another exemplary embodiment, the catalyst particles 120 may be attached in a state of metal oxides. Alternatively, the catalyst particles 120 may be prepared through hydrothermal synthesis.

The ceramic catalyst 100 having the catalyst particles 120 attached to the surface of the nanostructure 110 may be formed through hydrothermal synthesis after forming the nanostructure 110 and adding the catalyst metal-containing precursor. In this case, the catalyst particles 120 may be a particle composed of a metal oxide, so that the catalyst particles 120 in a metallic state may be attached to the surface of the nanostructure 110 and then oxidized to change into a metal oxide, or the catalyst particles 120 in a metal oxide state may be directly attached to the surface of the nanostructure 110.

The catalyst particles 120 may be prepared through hydrothermal synthesis. Hydrothermal synthesis is a method of synthesizing oxides, hydrates or metal powders or growing crystals thereof in a solution or suspension state by using dependencies on material solubility, temperature, pressure and a solvent concentration. A metal-containing precursor may be added not only in a solution form but also in a powder form, and therefore, during a synthesis process through hydrothermal synthesis, the metal particles may be attached to the surface of the nanostructure 110 and then oxidized. Or metal oxide particles may also be directly attached to the surface of the nanostructure 110.

As the size of individual catalyst particles 120 becomes smaller, the active area for the entire catalyst particles 120 attached to the surface of the nanostructure 110 becomes greater thereby improving the catalyst activity. Therefore, the catalyst particles 120 having the optimum size may be prepared through hydrothermal synthesis by which the size and shape of the catalyst particles 120 may be adjusted according to the synthesis conditions such as temperature and pressure.

After the attaching of the catalyst particles 120, the method in accordance with an exemplary embodiment may further include dissolving and removing a part of ionic salts of the nanostructure 110 in a polar solvent.

After the particles composed of the metal oxide are attached to the surface of the nanostructure 110, a part of the nanostructure 110 may be removed to form the void space 130 by using a polar solvent such as water or acetone in order to increase the specific surface area or catalyst active area of the ceramic catalyst 100. In this case, when being dissolved, the nanostructure 110 begins to be removed from the outer surface thereof, and when the nanostructure 110 is completely removed, structural collapse may occur, so that only a part of the nanostructure 110 may be removed, thereby partially forming the void space 130 inward from a portion where the nanostructure 110 and the catalyst particles are brought into contact with each other.

When a part of the nanostructure 110 is dissolved and removed to form the void space 130, the reactant reacted by the catalyst particles 120 moves into the void space 130 and may thus be in contact with the inner surface of the catalyst particles 120 as well as the outer surface thereof, so that the area in which the catalyst particles 120 may contact and react with the reactant may increase.

As described above, the properties (e.g., water-soluble property) of the nanostructure 110 for forming the ceramic catalyst 100 in which void spaces 130 are formed and the properties (e.g., non-soluble property) of the catalyst particles 120 attached to the surface of the nanostructure 110 are the same as those described in the above-mentioned embodiment, and thus repeated description is not provided herein.

Figure 4:
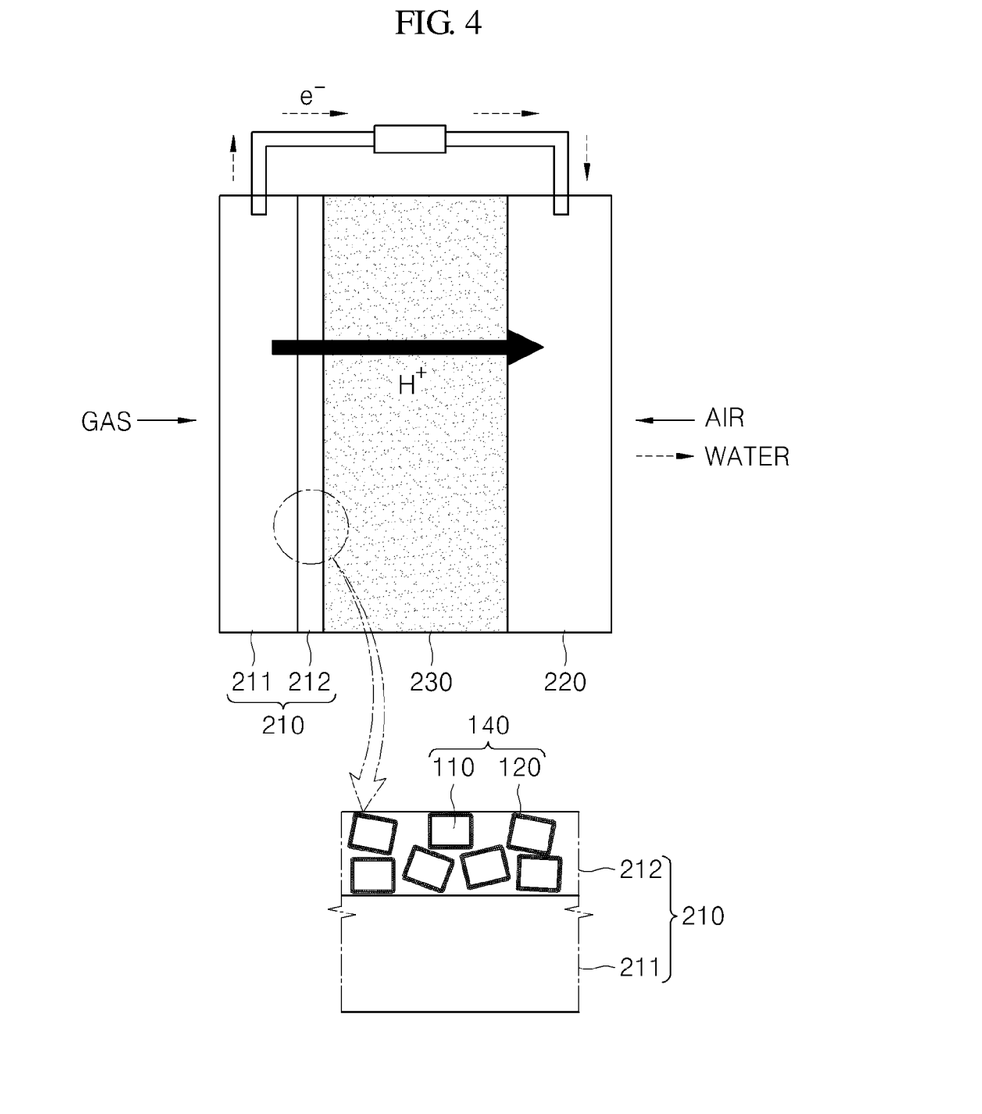
FIG. 4 is a cross-sectional view illustrating a fuel cell including a ceramic catalyst in accordance with yet another exemplary embodiment.

FIG. 4 is a cross-sectional view illustrating a fuel cell including a ceramic catalyst in accordance with yet another exemplary embodiment.

Referring to FIG. 4, a fuel cell in accordance with yet another exemplary embodiment includes: a fuel electrode 210 in which decomposition of fuel and an oxidation reaction of hydrogen are carried out; an air electrode 220 which is provided to correspond to the fuel electrode and in which a reduction reaction of oxygen is carried out; and a polymer electrolyte membrane 230 disposed between the fuel electrode 210 and the air electrode 220 to allow hydrogen ions to move from the fuel electrode 210 to the air electrode 220. Herein, the fuel cell 210 may include a ceramic catalyst 212 containing a nanostructure 110 composed of ionic salts, and catalyst particles 120 attached to the surface of the nanostructure 110; and a catalyst support 212 supporting the ceramic catalyst 212.

The fuel cell mainly includes a fuel electrode 210, an air electrode 220, and a polymer electrolyte membrane 230 disposed between the fuel electrode 210 and the air electrode 220, wherein the fuel electrode 210 and the air electrode cause an electrochemical reaction through an oxidation reaction of hydrogen and a reduction reaction of an oxidizing agent or oxygen. Methane may be used as a fuel of a fuel cell for generating electricity, and the methane may be decomposed from the ceramic catalyst 212 in accordance with an exemplary embodiment to generate hydrogen. The fuel is not limited thereto, and non-pretreated biogas or the like containing about 60% or more of methane may be used.

The fuel electrode 210 composed of the catalyst support 211 supporting the ceramic catalyst 212 and the ceramic catalyst 212 decomposes the fuel of the fuel cell to generate hydrogen, and converts the generated hydrogen into hydrogen ions and electrons by oxidation reaction. The polymer electrolyte membrane 230 functions as an ion exchange for moving the hydrogen ions generated in the fuel electrode 210 to the air electrode 220, and the air electrode 220 performs a reduction reaction of hydrogen ions and oxygen to function to generate water and heat having a predetermined temperature.

First, the ceramic catalyst 212, which is used for the fuel electrode 210 and decomposes methane and oxidizes hydrogen, may have a structure in which nanocomposites 140 composed of the nanostructure 110 and the catalyst particles 120 are three-dimensionally stacked in plurality on the catalyst support 211. In this case, a void space 130 may partially be formed between the nanostructure 110 and the catalyst particles 120, and the catalyst particles 120 may be insoluble in a polar solvent. The void space 130 and the catalyst particles 120 in accordance with an exemplary embodiment are the same as those described with reference to FIGS. 1 and 2, and a detailed description thereof will not be provided herein.

In exemplary embodiments, to maximize the catalyst active area in the space of the limited catalyst support body 211, the plurality of nanocomposite 140 in which the catalyst particles 120 are attached to the surface of the nanostructure 110 are three-dimensionally stacked on the catalyst support 211 to thereby form the ceramic catalyst 212. The catalyst particles 120 are not simply formed on the surface of the catalyst support 211 in the form of a thin film, but the catalyst particles 120 are three-dimensionally stacked on the catalyst support 211, i.e., in the limited space, in the form of the nanocomposites 140 in which the catalyst particles 120 are attached to the surface of the nanostructure 110, thereby increasing the catalyst reaction area per unit area. Accordingly, the decomposition rate of the fuel or the generation rate of the hydrogen may be further improved as compared to the existing catalyst particles 120.

Moreover, the reaction activity of decomposing the fuel to generate hydrogen is increased, so that the decomposition reaction temperature performed at the high temperature may be lowered to be less than 200° C. and the poisoning rate of the catalyst may be reduced to increase the service life and efficiency of the fuel cell. More details will be described later.

In the structure of the nanocomposite 140, the nanostructure 110 may be at least partially ionized by the water inside the fuel cell.

Inside the fuel cell, there are water vapor which is supplied into the fuel cell to improve the catalyst activity for a predetermined period of time, moisture which is supplied to the polymer electrolyte membrane 230 in a predetermined amount or more to move, to the air electrode 220, the hydrogen ions generated through oxidization of hydrogen, and water molecules which are contained in water generated as a reaction product of the fuel cell. The nanostructure 110 may be dissolved in a polar solvent, and also may have properties of being dissociated and ionized by the water in the fuel cell described above. That is, the nanostructure 110 may move electric charges in an operating environment of a fuel cell containing water.

Generally, since the catalyst support 211 of the fuel cell plays a role of a current collector for moving the current generated from the catalyst to a separator plate in addition to the role of supporting the catalyst, the catalyst support 211 should have a high electric conductivity such that the generated electric current is collected well. Accordingly, the catalyst should be supported on the catalyst support 211 such that the catalyst is in contact with the surface of the catalyst support 211 in order to transfer the generated electric current to the catalyst support 211.

When only the catalyst particles 120 are used as a catalyst for the fuel electrode 210 of the fuel cell, the catalyst support 211 does not move the electric current generated in the catalyst in the case where the catalyst particle 120 is separated from the catalyst support 211. Therefore, there is a problem in that the fuel electrode 210 composed of the catalyst and the catalyst support 211 fails to act as the fuel electrode 210.

Meanwhile, the catalyst particles 120 in accordance with an exemplary embodiment are attached to the entire surface of the three-dimensional nanostructure 110, so that even if some of the catalyst particles 120 are separated from the catalyst support 211 by a certain distance, the nanostructure 110 is dissociated by the water generated or supplied in the fuel cell to function as a conductor capable of transferring electric charges, thereby enabling the fuel cell to be operated. In other words, since the catalyst particles 120 in accordance with an exemplary embodiment are supported on the catalyst support 211 in a state of being attached to the entire surface of the nanostructure 110 having a three-dimensional shape, some of the catalyst particles 120 are in contact with the surface of the catalyst support 211, but others of the catalyst particles 120 may not be in direct contact with the surface of the catalyst support 211 due to the three-dimensional nanostructure 110. However, the nanostructure 110 in accordance with an exemplary embodiment may have properties of being dissociated and ionized by water in the fuel cell, and may thus serve as a conductor capable of transferring electric charges. Therefore, even when some of the catalyst particles 120 are separated from the catalyst support 211 by a certain distance, it is possible to move the electric current thereby enabling the fuel cell to be operated.

The fuel supplied to the fuel electrode 210 may be decomposed by the ceramic catalyst 212 at a temperature lower than 200° C., and the catalyst particles 120 may be particles made of a metal oxide.

As described above, the particles, which are made of a metal oxide and attached to the surface of the nanostructure 110, react with water molecules in the fuel cell to change into a compound having a hydroxyl group, that is, a hydroxide, the fuel supplied to the fuel electrode 210 is decomposed into hydrogen by means of the hydroxyl group contained in the hydroxide 210. In one exemplary embodiment, the reaction in which methane, which is the fuel supplied to the fuel electrode 210, reacts with the nickel oxide attached to the surface of the nanostructure, and is decomposed is represented by Reaction Formula 1 or 2.

[Reaction Formula 1]

[Reaction Formula 2]

Since the methane reacts with the particles of the metal oxide included in the ceramic catalyst 212 to change into hydrogen, as represented in the above Reaction Formulae 1 and 2, the catalyst particles 120 are formed of metal oxides, so that the fuel may be directly decomposed, and also the carbon monoxide which causes poisoning of the catalyst may be removed in a gas phase after being changed into carbon dioxide. Since the $CH_3$—O—Ni—OH and $CH_3$—O—Ni in the Reaction Formulae 1 and 2 may be changed into $Ni(OH)_2$ and NiO by unreacted hydrogen ions and residual hydrogen gas, the catalyst particle 120, after the reaction with methane, may return to the pre-reaction state and continuously cause methane decomposition reaction.

As described above, since the fuel may be decomposed by particles composed of a metal oxide rather than metal particles, the catalyst particles 120 may be particles made of a metal oxide formed through the oxidation of a base metal such as Cu, Mo, Mn, Co, Fe, W, Al, Ti, Si or Sn, rather than particles made of a noble metal such as Pt or Au that is chemically very stable and thus is not oxidized. In other words, the nickel oxide in Reaction Formulae 1 and 2 above is just an example, so that even when the catalyst particles 120 are composed of another metal oxide other than the nickel oxide, the same reaction as reaction formulae 1 and 2 may take place. In this case, unlike this exemplary embodiment, when a catalyst composed of metal particles to which oxygen atoms are not bonded is used as a catalyst for a fuel cell, poisoning, which is caused by carbon monoxide included in the fuel supplied into the fuel cell from the outside or by carbon monoxide generated through reaction between carbon in the methoxy group ($CH_3O$—R) and oxygen in the fuel in the case where methanol is used as the fuel, may occur so that it is difficult to perform the role as a catalyst.

Figure 5:
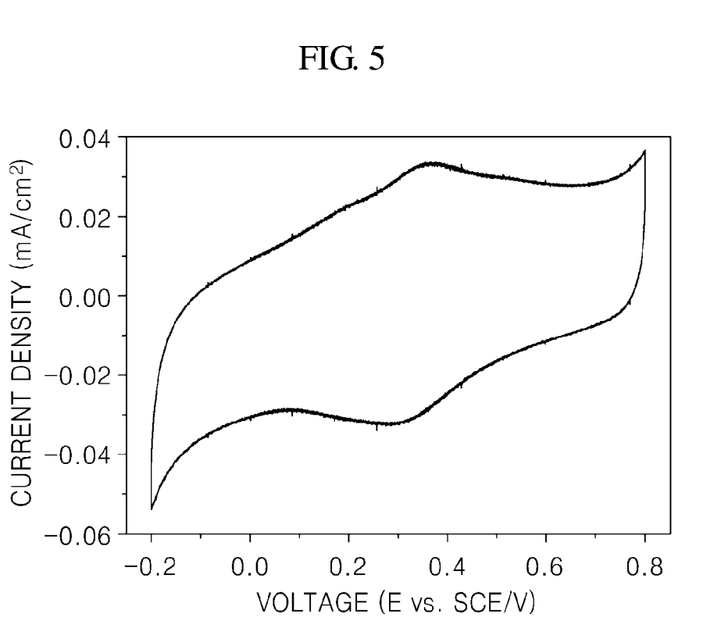
FIG. 5 is a graph showing the activity of catalyst particles in accordance with yet another exemplary embodiment.

FIG. 5 is a graph showing the activity of catalyst particles in accordance with yet another exemplary embodiment. The ceramic catalyst 212 is immersed in distilled water in which methane is dissolved. Thereafter, cyclic voltammetry (CV) among electrochemical analysis methods is used to observe the catalyst characteristics. The cyclic voltammetry is a method of analyzing the electric current response characteristics while varying the potential at a predetermined rate in a given potential range, and may be used mainly for analyzing the activity of a catalyst in a fuel cell.

Referring to FIG. 5 illustrating CV results for the catalyst particles 120 in an aqueous solution of methane, it was observed that $Ni^{3+}$ changed to $Ni^{2+}$ by oxidation at around 0.38 V, which demonstrated that NiO in Reaction Formula 1 or $NiO_2$ in Reaction Formula 2 was changed into NiOH or $Ni(OH)_2$. Also, at 0.29V, it was observed that $Ni^{2+}$ was changed to $Ni^{3+}$ by reduction, which demonstrated that the NiOH in Reaction Formula 1 or $Ni(OH)_2$ in Reaction Formula 2 was changed to NiO or $NiO_2$.

As described above, since the catalyst particles 120 attached to the surface of the nanostructure 110 are made of metal oxides, the fuel may be directly decomposed, and also the poisoning phenomenon of the catalyst caused by carbon monoxide may be very easily alleviated or reduced without a complicated system configuration. The nanocomposites 140 in which the catalyst particles 120 are attached to the surface of the three-dimensional nanostructure 110 are three-dimensionally stacked in plurality on the catalyst support 211 to form the ceramic catalyst 212, so that the reaction activity for decomposing the fuel in the limited space of the catalyst support 211 may be enhanced. Therefore, the fuel decomposition temperature that was high may be reduced to a temperature of lower than 200° C. In this case, when the fuel decomposition temperature is higher than 200° C., a low-temperature type fuel cell such as a polymer electrolyte fuel cell has a problem in that the polymer electrolyte membrane 230 configuring the fuel cell is unable to withstand high-temperature heat and is melted to lose its function as an ion conductor, so that the fuel cell fails to operate.

In other words, in this exemplary embodiment, the ceramic catalyst 212 having improved catalyst activity may be formed. Consequently, it is unnecessary to carry out a reaction at high temperature under low pressure, but it is possible to carry out a reaction at a temperature of less than 200° C. in order to achieve high decomposition rate of methane. Furthermore, the problem in which the polymer electrolyte membrane 230 is melted to cause the fuel cell not to operate may be also solved. In addition, a high efficiency in methane decomposition may be obtained even at a temperature lower than 200° C. at which the polymer electrolyte membrane 230 is unable to be melted.

An oxide layer formed on the surface of the catalyst support 211 may be further provided.

Before the oxide layer is formed on the surface of the catalyst support 211, when the catalyst support 211 is a carbon-based catalyst support 211, acid treatment may be performed to improve the ratio of supporting the ceramic catalyst 212 on the catalyst support to thereby break the strong carbon-carbon covalent bond. That is, the Van der Waals force on the surface of the catalyst support 211 is reduced within a range in which the intrinsic property of the carbon-based catalyst support 211 is not deteriorated through the acid treatment, thereby breaking the carbon-carbon bond, so that the catalyst may be uniformly supported on the entire surface of the catalyst support 211 and the activity of the catalyst may thus be uniform.

After the acid treatment is performed on the surface of the catalyst support 211, the oxide layer may be formed on the surface of the catalyst support in order to improve the ratio of supporting the ceramic catalyst 212 on the catalyst support and the efficiency of decomposing methane. As described above, since the methane is decomposed by the particles made of the metal oxide contained in the ceramic catalyst 212, when the oxide layer is formed on the surface of the catalyst support 211, more methane decomposition may be caused by not only the metal oxide attached to the surface of the nanostructure 110 but also the oxide formed on the surface of the catalyst supporting body 211. Furthermore, the specific surface area of the catalyst support 211 is improved, so that more ceramic catalysts 212 may be supported.

In exemplary embodiments, a catalyst active area of the catalyst particle per unit area may be increased by forming a ceramic catalyst having the catalyst particle substantially serving as a catalyst on the surface of a nanostructure, so that the reactant may contact the catalyst particle, and thus the ceramic catalyst may have greater catalyst activity than conventional catalysts.

In addition, a void space is partially formed between the nanostructure and the catalyst particle, whereby the reactant moves into the void space, and may react with the inner surface as well as the outer surface of the catalyst particle. In other words, since the formation of the void space further increases the area in which the catalyst particle may react with the reactant, a sufficient reaction active area may be provided to the reactant.

Particularly, the nanostructure tends to be dissociated and ionized by water to act as a conductor capable of transferring electric charge. Thus, when the nanostructure is used for a fuel cell, an electric current can flow even if some of catalyst particles attached to the surface of the nanostructure are not in direct contact with the surface of the catalyst support, thereby enabling the fuel cell to be operated.

Since the catalyst particles attached to the surface of the nanostructure is composed of a metal oxide, the gas causing poisoning of the catalyst may be removed in a gas phase, so that the poisoning phenomenon of the catalyst may be easily alleviated or reduced without any complicated system configuration.

Although a ceramic catalyst, a method of manufacturing a ceramic catalyst, and a fuel cell have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A ceramic catalyst comprising:
   a nanostructure composed of ionic salts; and
   catalyst particles attached to a surface of the nanostructure,
   wherein the nanostructure is soluble in a polar solvent,
   the catalyst particles are insoluble in the polar solvent, and
   a portion of the nanostructure is dissolved and removed by the polar solvent to form a void space between the nanostructure and the catalyst particles.

2. The ceramic catalyst of claim 1, wherein the catalyst particles comprise particles composed of metal oxide.

3. The ceramic catalyst of claim 1, wherein the nanostructure has properties of being dissociated and ionized by water.

4. A method of preparing a ceramic catalyst, the method comprising:
   forming a nanostructure composed of ionic salts; and
   attaching catalyst particles to a surface of the nanostructure,
   wherein the nanostructure is soluble in a polar solvent, and
   the catalyst particles are insoluble in the polar solvent,
   wherein the method further comprises dissolving and removing a part of the ionic salts of the nanostructure in the polar solvent, after the attaching of the catalyst particles.

5. The method of claim 4, wherein the attaching of the catalyst particles comprise:
   attaching metal particles to the surface of the nanostructure; and
   oxidizing the metal particles.

6. The method of claim 4, wherein, in the attaching of the catalyst particles, metal particles are attached in a metal oxide state.

7. The method of claim 4, wherein, in the attaching of the catalyst particles, the catalyst particles are prepared through hydrothermal synthesis.

8. A fuel cell comprising:
   a fuel electrode in which decomposition of fuel and an oxidation reaction of hydrogen are carried out;
   an air electrode in which a reduction reaction of oxygen is carried out; and
   a polymer electrolyte membrane disposed between the fuel electrode and the air electrode to allow hydrogen ions to move from the fuel electrode to the air electrode,
   wherein the fuel electrode includes:
   a ceramic catalyst containing a nanostructure composed of ionic salts, and catalyst particles attached to a surface of the nanostructure; and
   a catalyst support configured to support the ceramic catalyst,
   wherein the nanostructure is soluble in a polar solvent,
   the catalyst particles are insoluble in the polar solvent, and
   a portion of the nanostructure is dissolved and removed by the polar solvent to form a void space between the nanostructure and the catalyst particles.

9. The fuel cell of claim 8, wherein the ceramic catalyst is obtained by three-dimensionally stacking, on the catalyst support, a plurality of nanocomposites composed of nanostructures and catalyst particles.

10. The fuel cell of claim 8, wherein the nanostructure is at least partially ionized by water inside the fuel cell.

11. The fuel cell of claim 8, wherein a fuel supplied to the fuel electrode is decomposed by the ceramic catalyst at a temperature lower than 200° C.

12. The fuel cell of claim 8, further comprising an oxide layer formed on a surface of the catalyst support.

13. The fuel cell of claim 8, wherein the catalyst particles comprise particles composed of a metal oxide.

14. A ceramic catalyst comprising:
   a nanostructure composed of ionic salts; and
   catalyst particles attached to a surface of the nanostructure,
   wherein the nanostructure is soluble in a polar solvent,
   the catalyst particles are insoluble in the polar solvent, and
   a void is formed between the nanostructure and the catalyst particles.

* * * * *